United States Patent [19]

Engdahl

[11] 4,005,400
[45] Jan. 25, 1977

[54] DATA ENTRY AND DECODING SYSTEM FOR SCRIPTED DATA

[75] Inventor: Jean Engdahl, Bienne, Switzerland

[73] Assignee: Societe Suisse pour l'Industrie Horologere Management Services S.A., Bienne, Switzerland

[22] Filed: Apr. 22, 1975

[21] Appl. No.: 570,453

[30] Foreign Application Priority Data

Apr. 30, 1975 United Kingdom ............ 18902/75

[52] U.S. Cl. .............................. 340/365 R; 178/18; 58/152 R; 340/146.3 SY; 340/324 R
[51] Int. Cl.² ......................................... G08C 1/00
[58] Field of Search .......... 340/146.3 SY, 146.3 F, 340/146.3 Z, 324 R, 324 M, 365 R; 58/152 R; 178/18–20

[56] References Cited

UNITED STATES PATENTS

| | | | |
|---|---|---|---|
| 2,964,734 | 12/1960 | West | 340/146.3 AQ |
| 3,108,254 | 10/1963 | Dimond | 340/146.3 AQ |
| 3,142,039 | 7/1964 | Irland et al. | 340/146.3 SY |
| 3,559,170 | 1/1971 | Barnes | 340/146.3 Z |
| 3,585,589 | 6/1971 | Reilly | 340/146.3 Z |
| 3,803,834 | 4/1974 | Reese | 58/152 R |

*Primary Examiner*—Marshall M. Curtis
*Attorney, Agent, or Firm*—Griffin, Branigan and Butler

[57] ABSTRACT

A conductive stylus is utilized in conjunction with conductive segments to provide for data entry into extremely small calculators such as might be incorporated in an electronic digital watch case. Multi-bit codes, representing the segments contacted by the stylus, are generated and stored as the stylus moves over the segments. These codes are stored until a complete character has been scribed. The stored multi-bit codes are then analyzed in accordance with the segments contacted and the sequence in which they were contacted to determine what character was scribed.

9 Claims, 7 Drawing Figures

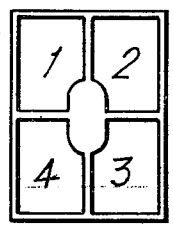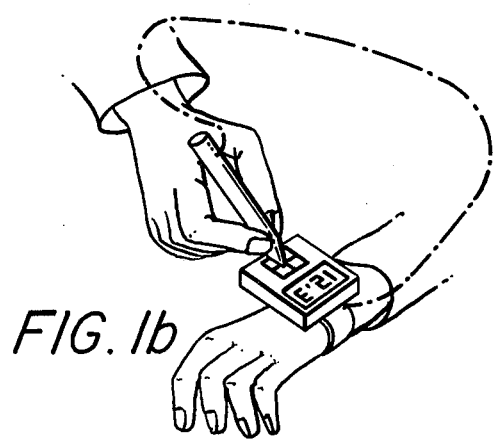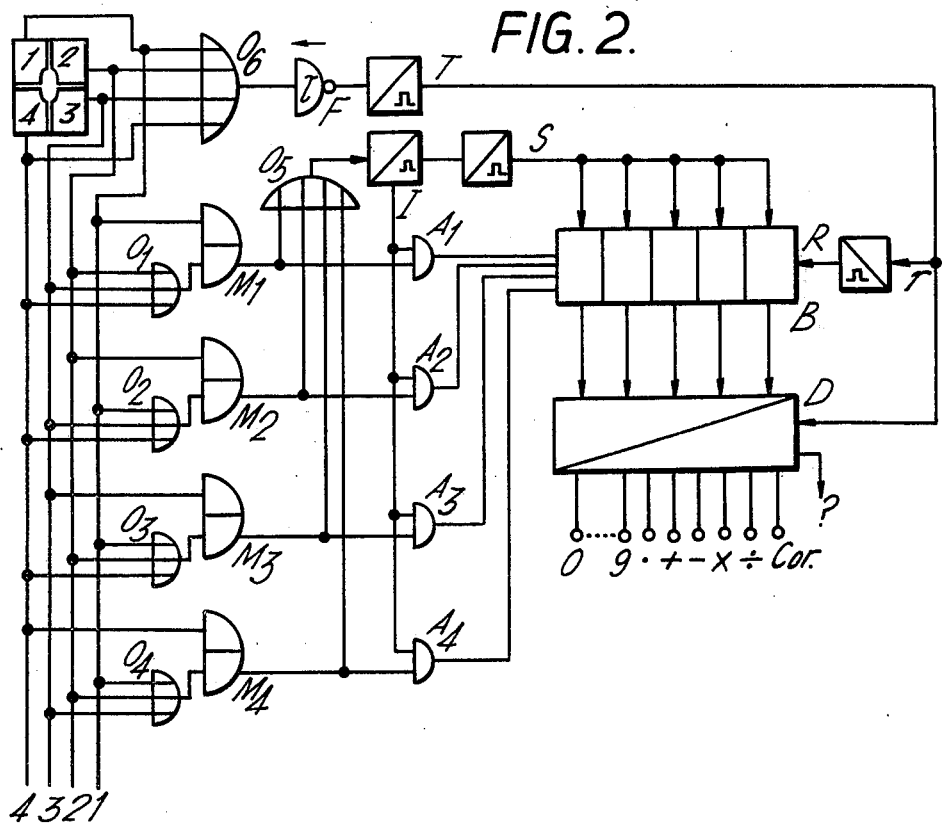
FIG. 1a   FIG. 1b
FIG. 2.

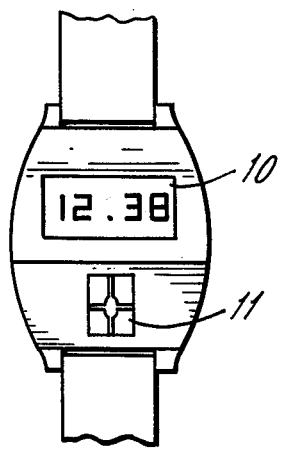
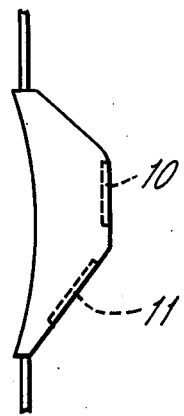
FIG. 3a            FIG. 3b
FIG. 5.
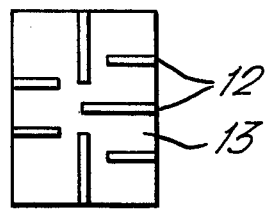

FIG. 4.

DATA ENTRY AND DECODING SYSTEM FOR SCRIPTED DATA

The present invention concerns a system for entering data into a calculator or other data handling apparatus.

In general where digital type calculators and data processing apparatus is concerned manual entry of data is effected by means of a keyboard having at least 10 data keys plus a certain number of keys for the entry of control signals. Present day calculators in view of the development of large scale integrated circuits have undergone a steady reduction in their overall size to the extent where there now exist vest-pocket versions of these devices. If one looks to the interior of such extra small electronic calculators it is apparent that a greater part of the space is occupied not by the electronic circuitry but rather by such things as the mechanical switches from the keyboard, the power cell and the display. The entire electronic circuitry may occupy no more than a few cubic millimeters of the available space. It is clear then that as far as the electronic circuitry is concerned, if this were the only item required for such a calculator, it could be placed within a watch case without greatly altering the lay-out of the watch parts, particularly where an electronic watch having digital display is concerned.

There does however remain a problem of how to enter data into such a calculator since the provision of a normal electromechanical keyboard on the surface available on a watch casing would seem to require reduction in the size of the keys themselves to the point where such keys would be usable only with difficulty.

The present invention provides a solution to the problem inasmuch as the normal keyboard is eliminated and what appears to the user is a small surface adjacent the display on which the user may trace with a conductive stylus the figure which he wishes to enter, one after the other in a more or less standard fashion, although with observation of certain rules. An arrangement may be provided whereby each figure when traced on the entry surface will be displayed so that the user can check that the entry has been correctly made. Control signals as normally found in small electronic calculators may also be sent by means of the same data entry surface and all that will be necessary is that the user acquaint himself with a few simple rules.

The invention accordingly provides a data entry and decoding system comprising a surface divided into a plurality of discrete electrically conducting zones electrically insulated from one another, an electric contact device adapted to transmit electric signals to the zones and logic circuits arranged and adapted to encode bit combinations in accordance with zones which are contacted and to store and decode permutations of said bit combination whereby standard alpha numeric characters when traced in a predetermined fashion on the surface generate coded signals for use in data handling apparatus.

For a better understanding of the invention reference will now be made to the accompanying drawings in which FIG. 1a shows a divided data entry surface as proposed by this invention.

FIG. 1b shows an electronic calculator adapted to be worn in the same manner as a wrist watch and which, of course, could in fact be part of an electronic wrist watch having a digital display.

FIG. 2 is a block diagram of the basic logic circuits which may be used to realize the invention.

FIGS. 3a and 3b respectively, show a top plan and side views of a wrist watch provided with the present data entry system.

Figure 4:
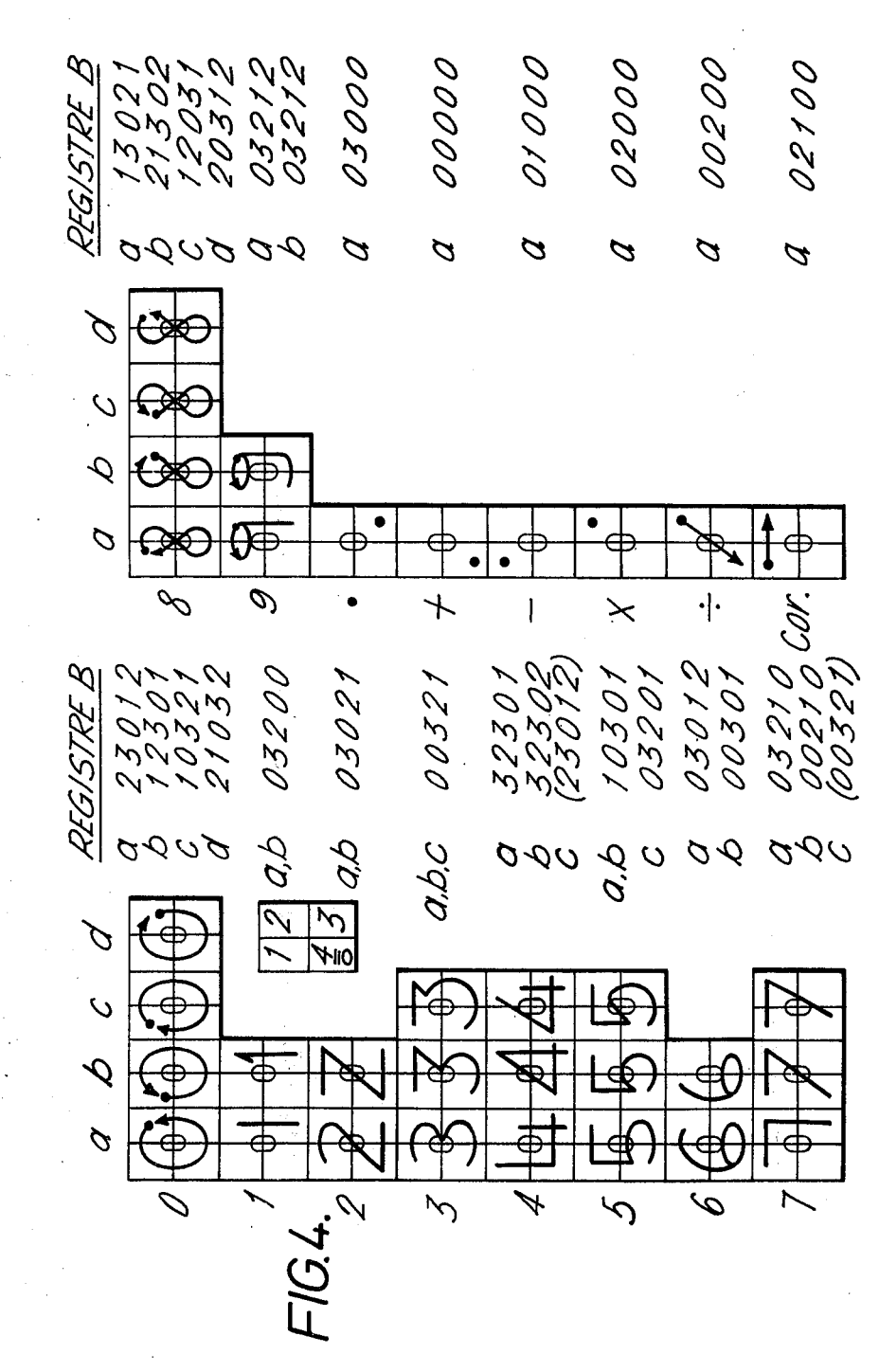

FIG. 4 shows in tabular form one scheme by which digits and commands would be traced on the entry surface in order to be correctly interpreted by the logic.

FIG. 5 shows an alternative lay-out for the entry surface.

The entry system comprises basically a surface as shown in FIG. 1a divided into four conductive segment zones numbered one to four and each of which is insulated from all the others. As shown in FIG. 1b, the calculator worn on the wrist or a wrist watch incorporating the present invention would, when worn, be in an electrical contact with the body of the user. Through the manipulation of a metallic stylus the user is able to trace certain patterns on the surface and so doing the conductive zones will be contacted either individually in the case of certain commands or in certain combinations of certain sequences as when a figure is traced.

The electric contacts thus made via the case work of the instrument and the body of the user are received and variously stored and coded so as to be usable either by a calculator circuit or to be displayed.

As the figure is traced on the surface it is initially stored as a plurality of signals, encoded and decoded. The entry of a figure will be also under control of certain timing circuits whereby if after a predetermined period of say two or three tenth of a second no segment of the surface has been activated the operation is considered terminated, similarly the entry of a series of digits would be considered terminated as soon as an operational instruction was given.

Refer now to FIG. 2 in conjunction with FIG. 4. In order to enter the digit 1 into the apparatus this is traced in form of a vertical stroke over zones 2 and 3 of the surface.

When the stylus first makes contact with zone 2 it will be seen that a signal is sent to and stored in a bistable device $M_2$. At the same time a timing device F, for example a monostable circuit, is triggered to indicate that the data is being entered.

This change of state of bistable device $M_2$ is detected by an OR-gate $O_5$, the output of which is used to generate an enabling signal I which is transmitted to AND-gates $A_1$, $A_2$, $A_3$, $A_4$ and a shift signal S which is used to shift the contents of shift register B one step to the right.

When the stylus passes from zone 2 to zone 3 it will be seen that at this point bistable storage device $M_3$ goes to its active state and at the same time the same signal coming from zone 3 is now transmitted through OR-gate $O_2$ to bistable device $M_2$ which reverts to its initial state.

The data being entered into the shift register B is encoded, that is to say where four zones are shown on FIG. 1a for example, a two-bit binary code will suffice. Coding might be:

1 = 01,
2 = 10,
3 = 11,
4 = 00.

A shift register may then comprise two binary storage devices per stage which are set or reset in accordance with a signal encoded from the various bistable devices $M_1$, $M_2$, $M_3$ or $M_4$.

Thus following the tracing of FIG. 1 by means of a vertical stroke touching successively zones 2 and 3 and the storage and shifting pulses generated thereby the register B will contain digits 0 3 2 0 0 coded as indicated above.

Following a predetermined time, as noted two or three tenth of a second, the time delay device F indicates the end of a character and generates a signal T which signals to the decoding circuit D that the data entered into the shift register B is to be decoded and transferred for further treatment elsewhere. Subsequently signal R is likewise generated to clear shift register B.

In order to enable the operator to know that the operation has proceeded correctly a signal coming from the decoder D may initially be transmitted to the display. When the operator sees that all is in order he may proceed to the tracing and introduction of the next digit.

Should a digit be incorrectly traced the decoder may also signal this fact as indicated by the output ? which may display a special sign or alternately may cause the display to blink and block all further operations until corrections have been effected.

The same entry surface may be used to enter control signals indicating that certain operations are to be carried out on the data entered. In the present version and as specifically shown for example in FIG. 4, zone 3, when contacted, enters a decimal point, and zone 4 provides a signal for addition, zone 1 subtraction and zone 2 multiplication. An oblique line traced from zone 2 to zone 4 may bring about division and an horizontal line traced from zone 1 to zone 2 may cancel the last entry. As shown specifically by FIG. 4 the various ways in which digits may be traced may be decoded in general to give a correct interpretation. Thus in tracing a 0 or an 8 four ways of doing this for each case are shown. Each of these four ways respectively results in a different sequence of digits stored in shift register B. The decoder may be designed to recognize all of these permutations as relating only to the digit 0 or 8 respectively. For some digits it will be necessary to exercise care in the tracing thereof. Thus for digit 4 should it be traced as shown in column c) of FIG. 4 this results in a permutation which is identical with one of the permutations for the digit 0. In this case a 0 would be entered. Since this would be signaled via the display the operator would realize that an error had been made in the method of tracing and he would therefore be enabled to correct the entry. The same is true in the case of version c) of the digit 7 which would, if not correctly traced, result in a 3 being entered. It is believed, however, that notwithstanding these minor difficulties an operator will quickly become accustomed to the manner in which digits ought to be written in order to appear correctly.

It will be noted that by using four zones on the entry surface a binary encoding scheme may be used which permits an essential simplification inasmuch as shift register B need only provide a two-bit storage for each of its five positions, thus a total of 10 binary storage devices.

A clear advantage which results from the present system based on the tracing sequence is that it is possible to distinguish two identical signals which are, however, traced in an inverse sense. Thus, for example, the command to correct an entry may be traced from left to right as shown in FIG. 4, but should it be traced from right to left it may have another meaning, such, for example, as command for calculating a reciprocal, extracting a square root, etc.

In FIG. 3 there is shown one possible form in which a wrist watch could be realized incorporating the present invention. Thus 10 represents the display which normally would be used to display the time of day and 11 represents the data entry surface as described in the detail herein which moreover may serve to introduce the various necessary control functions.

FIG. 5 shows a possible variant of the entry surface in which sensitive elements comprise conductive lines 12 placed on an insulating base 13. Herein are shown seven segments and this would be in order to give greater liberty in the tracing of the characters, but would naturally lead to greater complications in the coding and decoding logic.

Although the description of the system has been directed to the entry of numerical data and control signals it will be clear that the principles taught may go beyond this at the expense, of course, of greater complications in the coding and decoding logic. It is thus possible to foresee an arrangement in which letters of the alphabet could be similarly entered, should an apparatus be desired for this purpose. Although the system has been presented as a possible solution to the problem of providing very small data entry arrangements to be used for example on a wrist calculator or calculator incorporated into a wrist watch it is clear from the foregoing that no particular dimensional limitation in this respect is intended and should it be so desired, the entry system could be used on a much larger apparatus.

What we claim is:

1. A data entry and decoding system comprising: a surface divided into a plurality of discrete electrically conducting zones electrically insulated from one another, an electric contact device for transmitting electric signals to said zones as said electric contact device is moved over said surface in a path forming a data character; logic circuit means connected to said zones for generating a sequence of multi-bit combinations of signals, each multi-bit combination of signals representing a zone contacted by said contact device as said contact device is moved over said surface to form said data character, and the position of each multi-bit combination in said sequence corresponding to the sequence in which said zones are contacted; storing means responsive to said logic circuit means and having means for storing said multi-bit combinations of signals in accordance with the sequence in which they are generated; and decoder means responsive to said storage means for generating a pattern of signals representing said data character.

2. A data entry and decoding system as claimed in claim 1 wherein only four zones are provided, said zones being configured to permit the contact device to pass directly from any selected zone to any other zone whilst remaining in contact with the surface.

3. A data entry and decoding system as claimed in claim 1 wherein seven zones are provided in the form of conductive strips applied to an insulating base.

4. A data entry and decoding system as claimed in claim 1 wherein said logic circuit means includes a plurality of bistable storage devices having SET and CLEAR inputs and each said zone is coupled to the SET input of an associated bistable storage device and to the CLEAR input of each bistable storage device associated with the other zones whereby the successive contacting of zones by the contact device effects the setting of one only bistable device at each successive contact.

5. A data entry and decoding system as claimed in claim 4 wherein each bistable storage device has a SET output, said logic circuit means including an encoding network, and wherein said storage means is a shift register, said SET outputs from the bistable storage devices being coupled to the shift register through said encoding network.

6. A data entry and decoding system as claimed in claim 5 wherein said logic circuit means includes a gating and shift signal generator and wherein the SET outputs from the bistable storage devices are commonly coupled to said gating and shift signal generator, the outputs from said gating and shift signal generator providing an enabling signal for the encoding network and a shift signal for the shift register.

7. A data entry and decoding system as claimed in claim 1 wherein said logic circuit means includes a time delay signalling device and said zones are commonly connected to said time delay signalling device.

8. A data entry and decoding system as claimed in claim 7 wherein the output of the time delay signalling device is coupled to said decoder and to a reset input of the shift register whereby, following a predetermined delay, the combination of signals stored in the shift register are transferred to the decoder for further processing and the shift register is cleared.

9. A data entry and decoding system as in claim 1 and further comprising an electronic calculator incorporated into a wrist watch, the pattern of signals representing said data characters being coded by said decoder means into a code suitable for use in said calculator.

* * * * *